(12) United States Patent
Wang et al.

(10) Patent No.: US 11,002,763 B2
(45) Date of Patent: May 11, 2021

(54) PROBE FOR PIC DIE WITH RELATED TEST ASSEMBLY AND METHOD

(71) Applicant: GLOBALFOUNDRIES U.S. Inc., Santa Clara, CA (US)

(72) Inventors: Ye Wang, Essex Junction, VT (US); Hanyi Ding, Colchester, VT (US); Timothy M. Platt, Williston, VT (US)

(73) Assignee: GLOBALFOUNDRIES U.S. Inc., Santa Clara, CA (US)

( * ) Notice: Subject to any disclaimer, the term of this patent is extended or adjusted under 35 U.S.C. 154(b) by 134 days.

(21) Appl. No.: 16/100,297

(22) Filed: Aug. 10, 2018

(65) Prior Publication Data
US 2020/0049737 A1 Feb. 13, 2020

(51) Int. Cl.
*G01R 1/073* (2006.01)
*G01R 1/067* (2006.01)

(52) U.S. Cl.
CPC ....... *G01R 1/0735* (2013.01); *G01R 1/06772* (2013.01)

(58) Field of Classification Search
CPC .............. G01R 1/0735; G01R 1/06772; G01R 31/311; G01R 31/2851; G01R 31/3025; G01R 31/318511; G01R 1/07314; G01R 1/07342; G01R 31/2831; G01R 31/2884; G01R 31/2889; G01R 31/31728; G01R 31/318505; G01R 1/071; G01R 1/06733; G01R 31/2891; G01R 1/07; G01R 1/073; G01R 1/07307; G01R 1/07328; G01R 1/07335; G01R 1/07357; G01R 1/07364; G01R 1/07371; G01R 1/07378; G01R 1/07392; G01R 1/07321; G01R 1/07385; H01L 2924/00014; H01L 2924/00; H01L 2224/48091; H01L 2224/85399;
(Continued)

(56) References Cited

U.S. PATENT DOCUMENTS 4,697,143 A 9/1987 Lockwood et al.
5,583,445 A 12/1996 Mullen
(Continued)

FOREIGN PATENT DOCUMENTS

CN 105190287 A 12/2015
CN 106461889 A 2/2017

*Primary Examiner* — Lee E Rodak
(74) *Attorney, Agent, or Firm* — Anthony Canale; Hoffman Warnick LLC (57) ABSTRACT

Embodiments of the disclosure provide a probe structured for electrical and photonics testing of a photonic integrated circuit (PIC) die, the probe including: a membrane having a first surface and an opposing second surface and including conductive traces, the membrane being configured for electrical coupling to a probe interface board (PIB); a set of probe tips positioned on the membrane, the set of probe tips being configured to send electrical test signals to the PIC die or receive electrical test signals from the PIC die; and a photonic test assembly disposed on the membrane and electrically coupled to the conductive traces of the membrane, the photonic test assembly positioned for substantial alignment with a photonic I/O element of the PIC die, wherein the photonic test assembly is configured to transmit a photonic input signal to the photonic I/O element or detect a photonic output signal from the photonic I/O element.

19 Claims, 5 Drawing Sheets

(58) Field of Classification Search
CPC . H01L 2924/12042; H01L 2924/12043; H01L 2224/0401; H01L 2224/45015; H01L 2924/207; H01L 2223/54473; H01L 2224/16145; H01L 2224/81121; H01L 2225/06513; H01L 2225/06593; H01L 23/544; H01L 24/48; H01L 24/73; H01L 25/0657; H01L 25/18; H01L 2924/01032; H01L 2924/01033; H01L 2924/12041; H01L 2924/12044; H01L 2924/14; H01L 2924/30107; H01L 2924/3011; H01L 31/125; H01L 31/167

See application file for complete search history.

(56) References Cited

U.S. PATENT DOCUMENTS

| | | | |
|---|---|---|---|
| 5,623,213 | A | 4/1997 | Liu et al. |
| 5,642,054 | A | 6/1997 | Pasiecznik, Jr. |
| 8,885,157 | B2 * | 11/2014 | Masuda ............. G01R 31/2886 324/501 |
| 8,907,696 | B2 * | 12/2014 | Masuda ........... G01R 31/31917 324/750.23 |
| 2006/0109015 | A1 * | 5/2006 | Thacker ............... G01R 31/311 324/755.07 |
| 2007/0132467 | A1 * | 6/2007 | Jager ................. G01R 31/2886 324/754.07 |
| 2014/0203837 | A1 * | 7/2014 | Minemier .......... G01R 31/2851 324/762.03 |
| 2017/0160482 | A1 * | 6/2017 | Frankel ................. G02B 6/305 |

\* cited by examiner

PROBE FOR PIC DIE WITH RELATED TEST ASSEMBLY AND METHOD

BACKGROUND

Technical Field

The present disclosure relates to testing equipment for photonic integrated circuits (PICs). In particular, embodiments of the present disclosure include probes and test assemblies for testing PIC dies in wafer level, and related methods for testing a PIC die.

Related Art

In flip chip or wire bond processing of semiconductor integrated circuit (IC) chips, interconnect structures such as solder bumps or bonding pads are used to connect IC chips to packaging. To determine the field viability of an IC chip, a probe including an array of individual probe tips can contact the various solder bumps or bonding pads to create electrical connections and thereby test electric circuits within the wafer before it is diced and packaged. The rise of networking devices, such as the "Internet of Things" (IoT), with links to a data center has accompanied a larger number of signal-processing elements in semiconductor wafers. Some wafers may include photonic devices, e.g., photonic waveguides, photonic transmitters and receivers, etc., configured to relay signals through light transmission. Semiconductor chips may be modified, adapted, etc., to house the various components needed to transmit light from one component to another. Semiconductor chips which include photonic devices and microcircuitry are known as "photonic integrated circuits" (PICs). To ensure manufacturing quality and performance, each PIC must be tested for optical and electrical performances as well as signal processing fidelity, also known as optical-electrical (OE) and electrical-optical (EO) tests.

A technical challenge associated with PIC technology is the need to conduct optical and electrical and signal-processing tests of a semiconductor wafer before the product is diced, packaged, and deployed. Conventionally, a test house must have an optical alignment system, including fiber probes and positioners, in addition to an electrical probe and alignment system, such that fiber probes for light-in and out are properly aligned with corresponding elements on the PIC die. This process may consume substantial time and resources.

SUMMARY

A first aspect of the disclosure provides a probe structured for electrical and photonics testing of a photonic integrated circuit (PIC) die, the probe including: a membrane having a first surface and an opposing second surface and including conductive traces, the membrane being configured for electrical coupling to a probe interface board (PIB); a set of probe tips positioned on the membrane, the set of probe tips being configured to send electrical test signals to the PIC die or receive electrical test signals from the PIC die; and a photonic test assembly disposed on the membrane and electrically coupled to the conductive traces of the membrane, the photonic test assembly positioned for substantial alignment with a photonic I/O element of the PIC die, wherein the photonic test assembly is configured to transmit a photonic input signal to the photonic I/O element or detect a photonic output signal from the photonic I/O element.

A second aspect of the disclosure provides a test assembly for a photonic integrated circuit (PIC) die, the probe assembly including: a probe including: a membrane having a first surface and an opposing second surface, the membrane including conductive traces, a set of probe tips positioned on the first surface of the membrane and electrically coupled to the electrical contact pad through the conductive traces of the membrane, the set of probe tips being configured to send and receive electrical test signals through a set of electrical contacts on the PIC die, a photonic emitter disposed on the second surface of the membrane and electrically coupled to the electrical contact pad through the conductive traces of the membrane, the photonic emitter positioned for substantial alignment with a photonic I/O element of the PIC die, wherein the photonic emitter is configured to transmit a photonic input signal into the photonic I/O element of the PIC die, and a photonic receiver disposed on the second surface of the membrane, and electrically coupled to the electrical contact pads through the conductive traces of the membrane, the photonic receiver being positioned for substantial alignment with the photonic I/O element of the PIC die, wherein the photonic receiver is configured to detect a photonic output signal from the photonic I/O element of the PIC die; and a probe interface board (PIB) electrically coupled to the membrane through a set of electrical contact pads, wherein the PIB selectively applies a test signal to the probe to deliver power to each of the set of probe tips, the photonic emitter, and the photonic receiver.

A third aspect of the disclosure provides a method for testing a photonic integrated circuit (PIC) die, the method comprising: coupling a probe to the PIC die, wherein the probe includes: a membrane having a first surface and an opposing second surface, the membrane including conductive traces, a set of electrical contact pads on the membrane for electrically coupling the membrane to a probe interface board (PIB), a set of probe tips positioned on the first surface of the membrane and electrically coupled to the electrical contact pad through the conductive traces of the membrane, the set of probe tips being configured to send and receive electrical test signals through a set of electrical contacts on the PIC die, a photonic emitter disposed on the second surface of the membrane and electrically coupled to the electrical contact pad through the conductive traces of the membrane, the photonic emitter positioned for substantial alignment with a photonic I/O element of the PIC die, wherein the photonic emitter is configured to transmit a photonic input signal into the photonic I/O element of the PIC die, and a photonic receiver disposed on the second surface of the membrane, and electrically coupled to the electrical contact pads through the conductive traces of the membrane, the photonic receiver being positioned for substantial alignment with the photonic I/O element of the PIC die, wherein the photonic receiver is configured to detect a photonic output signal from the photonic I/O element of the PIC die; applying a voltage to the set of electrical contact pads of the probe to transmit a test signal to the set of probe tips, and cause the photonic emitter to transmit the photonic input signal to the photonic I/O element of the PIC die; and detecting the photonic output signal from the photonic I/O element of the PIC die with the photonic receiver.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings and it is to be understood that other embodiments may be used and that changes may be made without departing from the scope of the present teachings. The following description is, therefore, merely exemplary.

The present disclosure relates to probes, assemblies, and methods suitable for testing photonic integrated circuit (PIC) dies. PIC dies may include semiconductor wafers structured to include electrical components (e.g., wires, vias, transistors, and other devices) as well as photonic elements (e.g., an optical waveguide, photodiode, etc.) for transmitting and/or processing photonic signals. To ensure manufacturing quality and performance, each PIC must be tested for optical and electrical performances as well as signal processing fidelity, also known as optical-electrical (OE) and electrical-optical (EO) tests.

The disclosure overcomes technical limitations in conventional testing methods through a single probe for conducting electrical and optical tests. The probe features a membrane with conductive traces for providing electrical power to electrical and optical testing elements. The probe may substantially vertically align laser-emitting and laser-detecting components with photonic input and output elements ("I/O elements" herein), e.g., an interface for delivering photonic signals to optical circuitry of the PIC die when a set of probe tips are connected to the PIC die. As used herein, the term "substantial alignment" or "substantially aligned" can refer to any alignment by which it is possible for light to travel linearly between the two elements in substantial alignment with each other. Thus, it is possible for two "substantially aligned" elements to have differently-positioned or oriented centerline axes, provided that it is possible for photonic signals to travel between the two elements without significant transmission loss or interference. Manufacturing the probe to include photonic testing components aligned with photonic elements of a PIC die eliminates the need for separate testing equipment, and aligning the separate testing equipment with the PIC die before testing. Structures and methods according to the disclosure thus also eliminate errors which may arise from misalignment between a probe and a PIC die.

Figure 1:
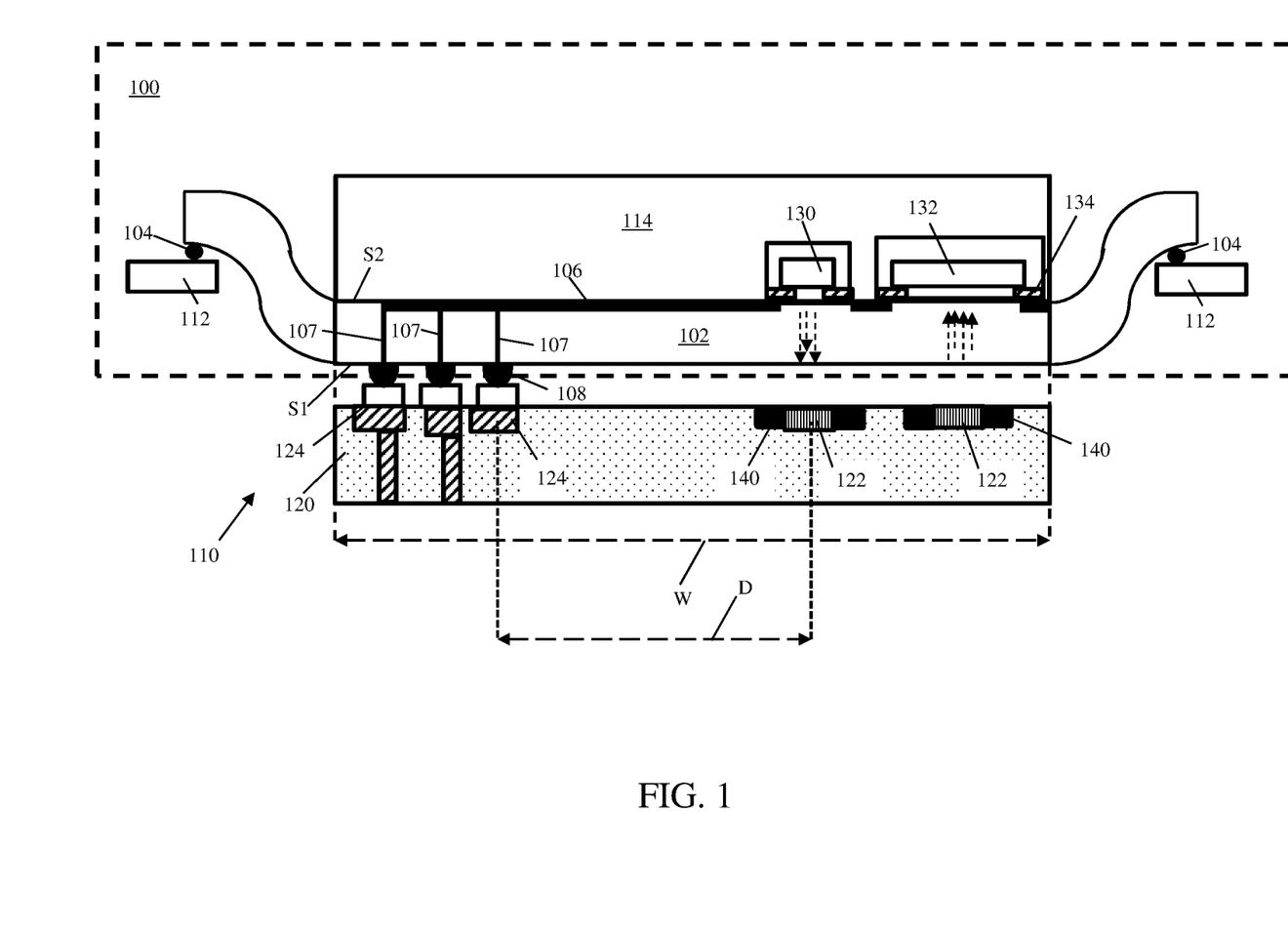
FIG. 1 shows a side view of a test assembly and a probe according to embodiments of the disclosure.

Referring to FIG. 1, the disclosure provides a probe 100 suitable for testing the electrical and photonic components of one or more PIC dies. Probe 100 may include a flexible membrane 102 with a first surface S1 at its lower vertical end, and a second surface S2 at its upper vertical end. Membrane 102 may include any currently known or later developed membrane material for probes, including transparent or non-transparent materials. Materials suitable for inclusion within membrane 102 may include one or more electrically non-conductive semipermeable materials, e.g., one or more polyimide-based compounds or other dielectric substances. Such materials may be mechanically flexible, allowing membrane 102 of probe 100 to be reused in multiple tests. Membrane 102 may also include materials for conducting electrical currents therethrough. Specifically, membrane 102 includes conductive traces, e.g., one or more metals deposited onto first or second surfaces S1, S2 or inside membrane 102 at a sufficient concentration to transmit electrical current across membrane 102 as discussed herein.

A set of electrical contact pads 104 of probe 100 may be positioned on membrane 102, e.g., at first surface S1, as an access point for delivering and/or receiving electrical power and signals. Electrical contact pads 104 may be composed of, e.g., a conductive metal formed on first surface S1 and/or second surface S2 of membrane 102 by way of deposition or other processes of coupling a metal to surfaces of membrane 102. Electrical contact pads 104 may be structured to be electrically coupled to a testing card, e.g., a probe interface board (PIB) 112, or other component for delivering and/or receiving electrical signals to and from membrane 102. One or more transmission lines 106 may be formed on membrane 102 for electrically connecting electrical contact pads 104 to various components of probe 100. Transmission lines 106 may include, e.g., copper, aluminum, zinc, and/or other metals suitable for use as a conductive region of a device. Transmission lines 106 may be formed within membrane 102 to provide a more direct electrical coupling between two or more elements, or between first surface S1 and second surface S2, than may otherwise be available solely through the conductive traces of membrane 102. Transmission lines 106 may be formed on membrane 102 by plating, deposition, and/or other processes of bonding a conductive substance, e.g., metal traces, onto membrane 102. Transmission lines 106 may be located on surfaces S1, S2 of membrane 102, and may also be positioned on sidewalls of membrane 102 and/or may pass vertically through membrane 102 as depicted in FIG. 1, e.g., by forming openings in membrane 102 and filling the openings with metal(s) to form transmission lines 106 therein, which may be separately identified as vias 107. Though not shown specifically in FIG. 1, each transmission line 106 may extend laterally into or out of the plane of the page to provide an electrical transmission path which circumvents other components. Transmission lines 106 may electrically couple electrical contact pads 104 to a set of probe tips 108 positioned on first surface S1 of membrane 102. Probe tips 108 may be positioned on first surface S1 of membrane 102, opposite second surface S2, to provide an electrical coupling to one or more devices under test. As will be discussed in further detail herein, applying a test voltage to electrical contact pads 104 causes an electrical current to be transmitted through membrane 102, optionally along transmission lines 106, to probe tips 108. Probe tips 108 thereby allow a user to test the electrical components (e.g., wires, vias, etc.) of a PIC die coupled to probe tips 108, as discussed herein.

Probe 100 may define part of a test assembly 110 for carrying out a test on one or more devices. Test assembly 110 thus may include probe 100 as well as probe interface board (PIB) 112 electrically coupled to membrane 102 through electrical contact pads 104. As shown, membrane 102 may be disposed about a probe body 114. Probe body 114 may be structured to guide membrane 102 into a recess within a device under test. As shown in FIG. 1, probe body 114 causes membrane 102 of probe 100, including probe tips 108, to be positioned vertically below PIB 112. Portions of membrane 102 in contact with probe body 114 may be mechanically coupled to probe body 114 by any currently known or later developed solution, including mechanical fasteners, adhesive bonds, etc. PIB 112 may include power-generating components (e.g., one or more batteries) and/or other components for generating and controlling test signals supplied to probe 100. To this extent, PIB 112 may include or otherwise be coupled to a power supply capable of supplying a test signal to probe 100, e.g., a direct current (DC) voltage, alternating current (AC) voltage, as well as test signals in the form of a mixed signal output, radio frequency (RF) output, and/or other inputs with adjustable electrical parameters (voltage, phase, gain, etc.).

During operation, probe 100 and test assembly 110 may be electrically and mechanically coupled to a PIC die 120 under test through probe tips 108. PIC die(s) 120 to be tested may be positioned vertically beneath first surface S1 of membrane 102. Although PIC die 120 may not be considered as part of test assembly 110, probe 100 may be shaped for substantial alignment with corresponding portions of PIC die 120. PIC die 120 includes several electrical and photonic elements which need to be tested before use. PIC die 120 may be at least partially composed of any currently known or later developed semiconductor material, which may include without limitation: silicon, germanium, silicon germanium, silicon carbide, and substances consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substances may include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

PIC die 120 includes one or more photonic I/O elements 122, e.g., light-processing elements of optical circuitry, for receiving and transmitting photonic signals to or from optical circuitry in PIC die 120. Photonic I/O element(s) 122 may be formed on PIC die 120 by forming one or more photomasks (not shown) on non-targeted portions of PIC die 120 and etching materials not covered by the photomask(s). It is understood that the size, shape, exterior surface profile, etc., of photonic I/O element(s) 122 may differ between implementations.

As shown, PIC die 120 may include a set of metal levels and vias (collectively "conduction paths") 124 therein. The electrical operability of conduction path(s) 124 must be tested in conjunction with the signal-transmitting properties of optical circuitry accessible through photonic I/O element(s) 122. Each conduction path 124 may generally include one or more electrically conductive materials etched through semiconductor materials in PIC die 120 to provide a wafer-to-wafer interconnect scheme compatible with 3D wafer-level packaging, e.g., electrical connections to underlying structures such as external structures or devices. Each conduction path 124 may be used to connect circuit elements on PIC die 120, e.g., various back-end-of-line conduction paths and/or other components. Conduction path(s) 124 may be formed of copper or other metals suitable for serving as a conductive wire in an IC structure. In the case of a via, conduction path(s) 124 may also include substantially annular refractory metal liners (not shown) disposed circumferentially about the metal(s) therein structure for providing additional electrical insulation and for preventing electromigration between conduction path(s) 124 and adjacent semiconductor regions in PIC die 120. Such liners may be composed of any currently known or later developed conductive material, e.g., refractory metals such as ruthenium (Ru), tantalum (Ta), titanium (Ti), tungsten (W), iridium (Jr), rhodium (Rh) and platinum (Pt), etc., or mixtures of thereof. Probe tips 108 of probe 100 may be positioned to transmit electrical currents (generated or transmitted, e.g., using PIB 112) to conduction paths 124 during a test.

Probe 100 includes other components for generating and transmitting photonic test signals for optical circuitry to be delivered and received using photonic I/O element(s) 122 of PIC die 120. Specifically, probe 100 may include a photonic emitter 130 and a photonic receiver 132 each disposed on first or second surface S1, S2 of membrane 102. Photonic emitter 130 and photonic receiver 132 may individually or collectively be considered to be a "photonic test assembly." Photonic emitter 130 and photonic receiver 132 are shown on second surface S2 solely as an example. Photonic emitter 130 and photonic receiver 132 optionally may be housed within probe body 114. Photonic emitter 130 and photonic receiver 132 each may be electrically coupled to electrical contact pads 104 through conductive traces of membrane 102, and/or optionally through transmission lines 106. Photonic emitter 130 may take the form of one or more currently known or later developed devices for transmitting optical signals, e.g., laser-emitting diodes or reference transmitter assemblies as noted elsewhere herein. Photonic receiver 132 may take the form of any currently known or later developed for detecting photonic outputs, e.g., photodiodes and/or reference receiver assemblies as also discussed herein. During manufacture of probe 100, photonic emitter 130 and photonic receiver 132 may be manufactured separately before being mechanically and electrically coupled to probe 100. Several solder bumps 134 may be coupled to first or second surface S1, S2 of membrane 102, each mounting photonic emitter 130 and photonic receiver 132 on membrane 102. Solder bumps 134 are shown on second surface S2 solely as an example. Solder bumps 134 may also electrically connect photonic emitter 130 and photonic receiver 132 to electrical contact pads 104 through transmission line(s) 106. Thus, electrical test signals may be delivered to probe tips 108 through electrical contact pads 104, while photonic emitter 130 and photonic receiver 132 can be driven and sampled through another set of electrical contact pads 104.

During a test, photonic emitter 130 may transmit an optical input signal to a substantially aligned photonic I/O element 122 of PIC die 120. Optical input signals may travel to optical circuitry of PIC die 120 via photonic I/O element 122. Optical circuitry of PIC die 120 in some cases emit an output signal to be transmitted to probe 100 through the same photonic I/O element(s) 122 or other photonic I/O element(s) 122. In other cases, optical circuitry on PIC die 120 may emit electrical signals as a result of other optical signals. FIG. 1 illustrates an example embodiment in which one photonic I/O element 122 receives an optical input, while another photonic I/O element 122 emits an optical output, but it is understood that a single photonic I/O element 122 may receive and emit optical signals in some cases. Photonic receiver 132 may be substantially vertically aligned with photonic I/O element(s) 122 which provide optical output signals, thereby detecting the optical output from PIC die 120 during an optical test of PIC die 120. The optical input signals emitted from optical emitter 130, and the output signals detected by optical receiver 132, may pass through substantially transparent or translucent materials included within membrane 102 before being detected and processed. The use of transparent or translucent materials in membrane 102 may affect light loss and or diffraction of signals passing therethrough. Thus, probe 100 may allow a user to simultaneously test photonic I/O element(s) 122 and conduction path(s) 124 of PIC die 120 under test.

Probe 100 and PIC die 120 may be structured for ease of optical alignment and contact between the two structures. For example, probe body 114 and portions of PIC die 120 may be structured for optical alignment with each other by having approximately the same horizontal width W. A horizontal separation distance D between probe tips 108 and photonic emitter 130 or photonic receiver 132 of probe 100 may be structured for optical alignment by being approximately equal to the horizontal separation between corresponding photonic I/O element(s) 122 and conduction path(s) 124 of PIC die 120. Thus, photonic emitter 130 and photonic receiver 132 may become substantially vertically aligned with photonic I/O element(s) 122 of PIC die 120 when probe tips 108 are coupled to conduction paths 124 of PIC die 120. Thus, a user may begin testing PIC die 120 with probe 100 and test assembly 110 without further adjusting the position of photonic emitter 130 and/or photonic receiver 132.

To further prevent signal degradation, PIC die 120 may include a set of optical mode converters 140, which converts the on-wafer optical waveguide to the photonic I/O element(s) 122, e.g. grating couplers. An optical grating coupler refers to a type of photonic I/O element 122 for converting light propagation from lateral to vertical or vice versa. Optical grating couplers may include, e.g., multiple peaks and valleys on the surface of PIC die 120. Each photonic I/O element 122 in the form of an optical grating coupler may be substantially aligned with photonic emitter 130 or photonic receiver 132 of probe 100.

Figure 2:
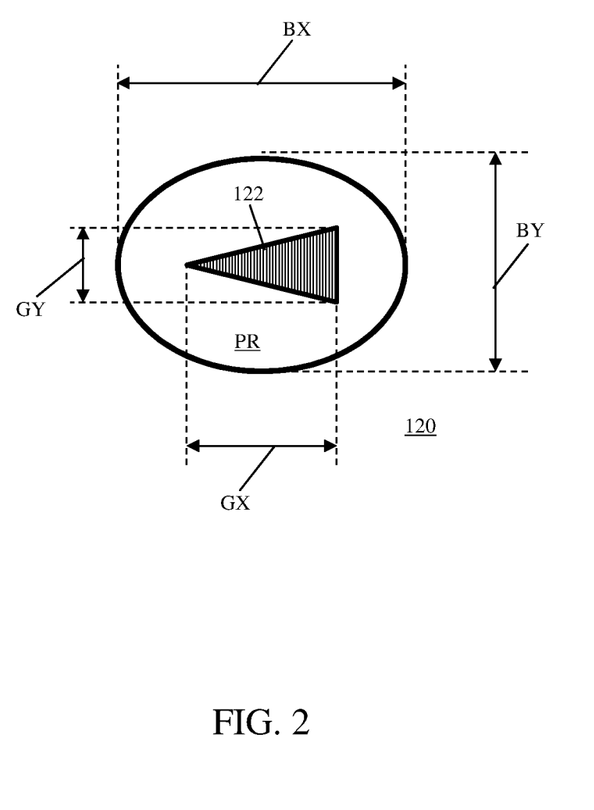
FIG. 2 shows a plan view of an optical grating coupler of a photonic I/O element substantially aligned with a beam area according to embodiments of the disclosure.

Referring briefly to FIG. 2, an expanded view of photonic I/O element 122 in the form of an optical grating coupler on PIC die 120 is shown to illustrate alignment with a beam area PR representing a beam size of light from photonic emitter 130 (FIG. 1) or a photodiode sensing area of photonic receiver 132 (FIG. 1). Such light may originate from a laser, light emitting diode (LED), or other light-emitting device. Photonic I/O element 122 may have a width GX and length GY that is less than a corresponding beam width BX and beam length BY for light transmitted by photonic emitter 130. For instance, grating width GX may be at most approximately forty μm and grating length GY may be at most approximately twenty-five μm. By comparison, beams from photonic emitter 130 may have a beam width BX of up to approximately eighty μm and a beam length BY of approximately sixty μm. The size of beam area PR and/or photonic I/O element 122 can vary from application to application, though it is preferable for the optical grating coupler to have a surface area that is less than beam area PR for photonic emitter 130 and/or photonic receiver 132. The reduced surface area of photonic I/O element 122 relative to beam area PR allows a loose alignment tolerance between photonic emitter 130 and photonic I/O element 122, and/or between photonic receiver 132 and photonic I/O element 122.

Figure 3:
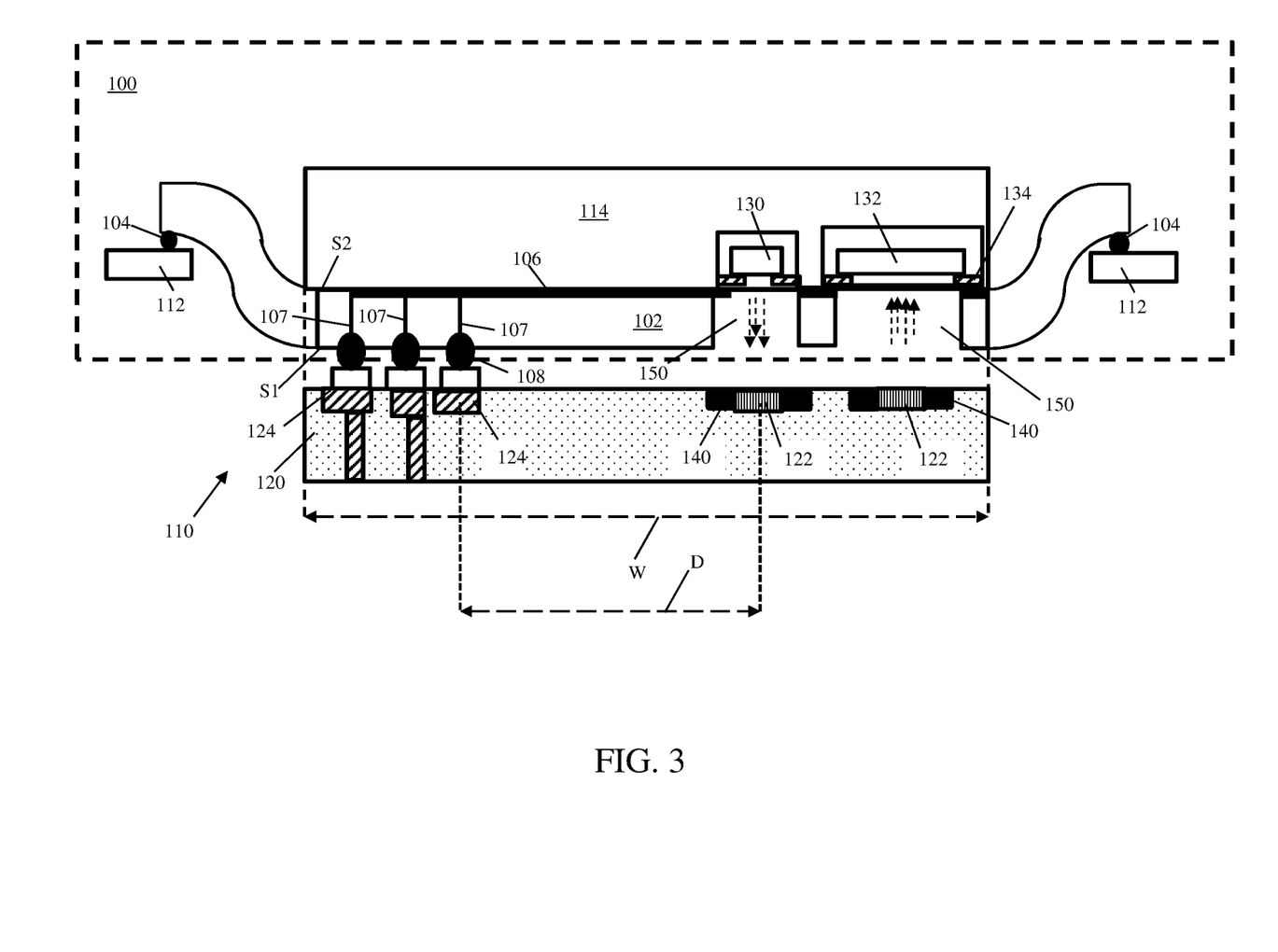
FIG. 3 shows a side view of a test assembly and a probe with light-transmitting openings through a membrane according to embodiments of the disclosure.

Referring now to FIG. 3, probe 100 may include additional structural features for allowing photonic signals to pass through membrane 102 as they travel out of photonic emitter 130 and/or into photonic receiver 132. According to an example, membrane 102 may include one or more openings 150 extending between first surface S1 and second surface S2. Each opening 150 may be positioned vertically beneath photonic emitter 130 or photonic receiver 132 to create a vertical passage for light traveling to, or from, photonic I/O element(s) 122 of PIC die 120. Openings 150 may be substantially cylindrical in shape, such that membrane 102 surrounds each opening 150. Openings 150 may be included in membrane 102 to mitigate the effect of any refractive materials included therein, and/or to ensure signal fidelity for more light-sensitive photonic I/O element(s) 122 and/or other components in PIC die 120.

In some cases, openings 150 may be hollow to permit light to pass through membrane 102. In other cases, openings 150 may include light-transmitting or light-focusing materials configured to direct light toward photonic I/O elements 122 or photonic receiver 132. In such cases, openings 150 may include one or more lenses configured to concentrate light toward the location of photonic I/O element(s) 122 and/or photonic receiver(s) 132. In such cases, the lenses formed within opening(s) 150 may be structured to focus light traveling in an upward or downward direction based on whether opening 150 is aligned with photonic emitter 130 or photonic receiver 132.

Figure 4:
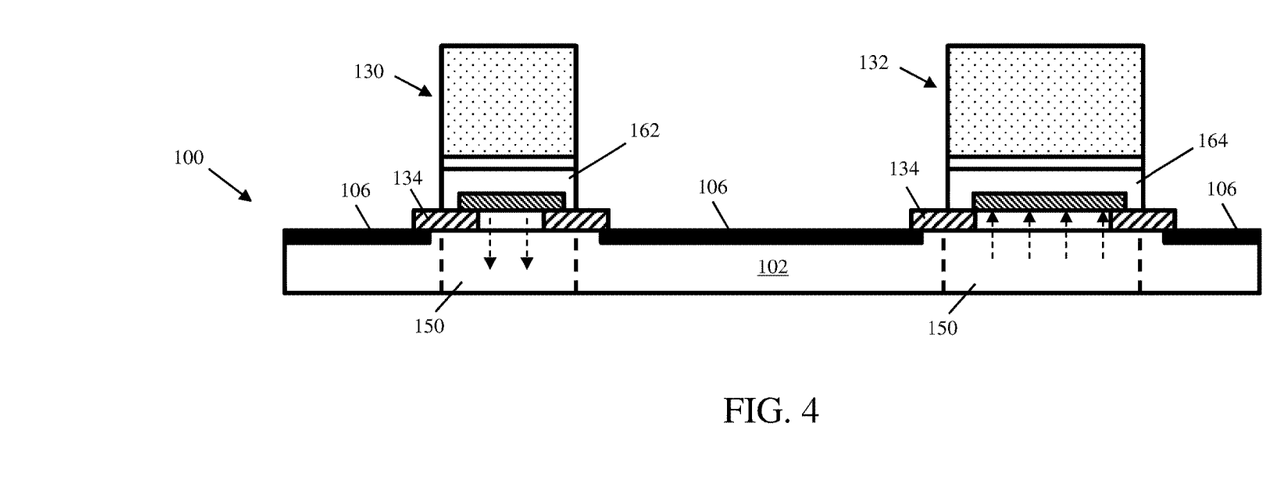
FIG. 4 shows a side view of a photodiode and laser diode on a probe according to embodiments of the disclosure.

Turning now to FIG. 4, example embodiments of photonic emitter 130 and photonic receiver 132 are shown in further detail. Photonic emitter 130 may take the form of, e.g., a laser diode 162 configured to emit laser beams for transmission to PIC die 120 (FIGS. 1, 3) as photonic input signals. A laser diode 162 refers to a component which includes multiple semiconductor layers joined at a p-n junction (i.e., a physical junction between two oppositely-doped semiconductor materials) and coupled to an emitter for generating beams of light. Laser diode 162, as shown, may be coupled to solder pad(s) 134 to receive an electrical power from membrane 102 and/or transmission line(s) 106 and thereby generate photonic signals for transmission to PIC die 120. Photonic receiver 132 similarly may take the form of a photodiode 164. Photodiode 164 may be structured similarly to laser diode 162, with the distinction of being configured to generate an electrical output current based on detected light from PIC die 120. To this extent, photodiode 164 may also include a set of doped semiconductor materials electrically coupled to membrane 102 and/or transmission line(s) 106 through solder pad(s) 134. Photodiode 164 may detect incoming light to generate an electrical signal indicative of the photonic output from PIC die(s) 120 under test.

Figure 5:
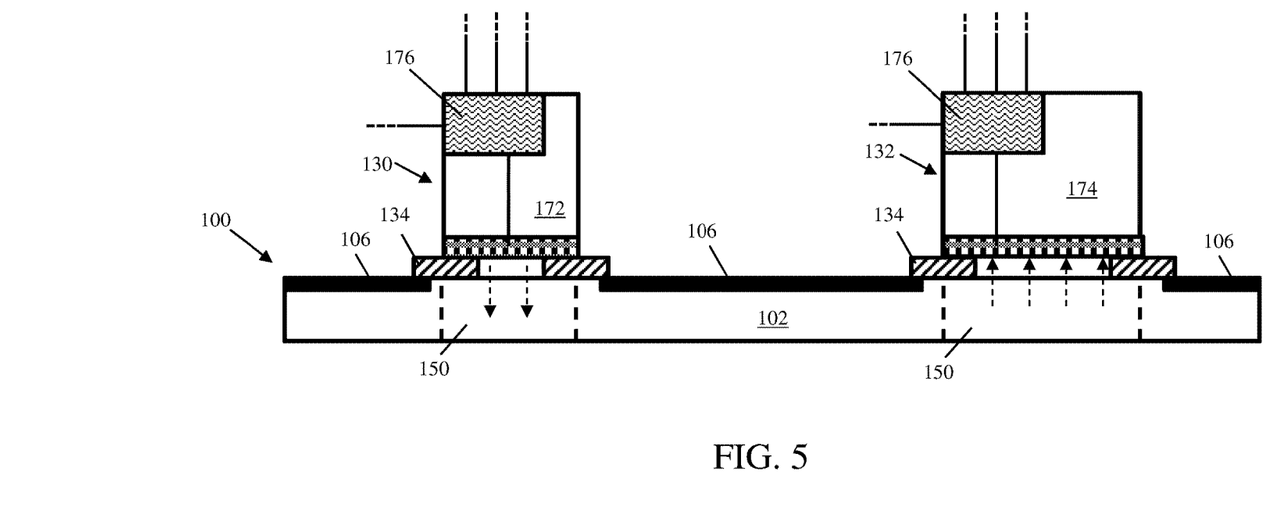
FIG. 5 shows a side view of a reference transmitter assembly and a reference receiver assembly according to embodiments of the disclosure.

Turning to FIG. 5, photonic emitter 130 and/or photonic receiver 132 may include other devices for emitting and detecting photonic signals. It is understood that the embodiments of photonic emitter 130 and photonic receiver shown in FIG. 5 may be implemented together with, or separately from, the embodiments of photonic emitter 130 and/or photonic receiver shown in FIG. 4 and described elsewhere herein. Photonic emitter 130 may include, e.g., a reference transmitter assembly 172. Photonic receiver 132 may similarly take the form of, e.g., a reference receiver assembly 174. Reference transmitter assembly 172 and reference receiver assembly 174 may include controller(s) 176 for sending and receiving digital signals to control the operation of photonic emitter 130 and/or photonic receiver 132. A "reference transmitter" or "reference receiver" refers to a controllable component which emits or receives light at varying wavelengths, intervals, etc., based on encoded commands. To this extent, reference transmitter assembly 172 and/or reference receiver assembly 174 may include controllable light emitters and/or receivers for varying photonic inputs and/or outputs as directed by controller(s) 176. In any case, reference transmitter assembly 172 and/or reference receiver assembly 174 may be sized for placement on membrane 102, and may be electrically coupled to membrane 102 and/or transmission line(s) 106 through solder pad(s) 134 as discussed elsewhere herein. Each assembly 172, 174 may be electrically and/or wirelessly coupled to other components for controlling the operation of assemblies 172, 174 as noted by phantom lines for each assembly 172, 174 in FIG. 5.

Figure 6:
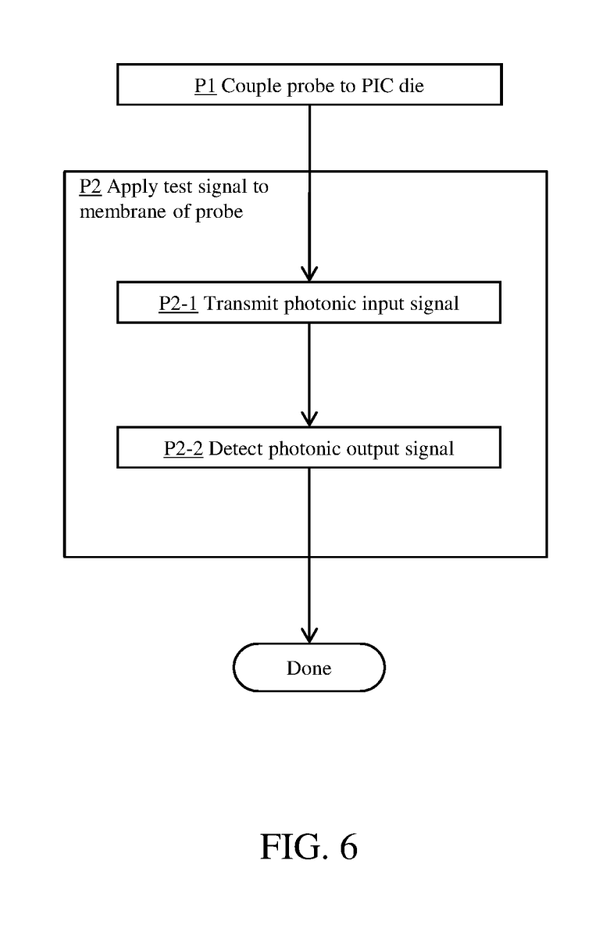
FIG. 6 shows an illustrative flow diagram of a method according to embodiments of the disclosure.

Turning now to FIGS. 1 and 6 together, embodiments of the disclosure provide methods for testing PIC die 120 with probe 100 and test assembly 110. A first process P1 may involve coupling probe 100 to PIC die 120. The coupling of probe 100 to PIC die 120 may include, e.g., electrically coupling probe tip(s) 108 of probe 100 to electrical contacts to conduction path(s) 124 of PIC die 120. Process P1 may also include, e.g., coupling PIB 112 to electrical contact pads 104 of probe 100, though it is possible for PIB 112 to be coupled to probe 100 in another process (e.g., a preliminary step such as the manufacturing of test assembly 110). In any case, probe 100 and/or test assembly 110 may include any or all of the various elements and features described herein with respect to FIGS. 1-5. Upon coupling probe 100 to PIC die 120 under test, test assembly 110, photonic emitter 132 and photonic receiver 134 may automatically be substantially aligned with photonic I/O element(s) 122, without any additional adjustment or alignment between probe 100 and PIC die 120 being needed. Probe 100 and test assembly 110 are ready to conduct an electrical and photonic test of PIC die 120 after process P1 concludes.

After process P1 is completed, the method may continue to process P2 of applying a test signal to electrical contact pads 104 of probe 100, e.g., using PIB 112. Applying the test signal to electrical contact pads 104 in process P2 may transmit a test signal to conduction path 124 of PIC die 120, while also allowing photonic emitter 130 to transmit a photonic input signal to photonic I/O element 122 of PIC die 120 as discussed elsewhere herein. Thus, process P2 allows a user to conduct an electrical test and a photonic test of PIC die 120 simultaneously. The photonic testing during process P2 may also be separated into a set of sub-processes P2-1 and P2-2. Sub-process P2-1 may include, e.g., transmitting a photonic input signal to photonic I/O element 122 of PIC die 120 using photonic emitter 130. Where applicable, light transmitted from photonic emitter 130 may pass through opening(s) 150 within membrane 102 before reaching photonic I/O element(s) 122. In cases where photonic I/O element(s) 122, includes an optical grating, the photonic input signal may be transmitted to the optical grating of photonic I/O element 122. Following sub-process process P2-1, the method may include another sub-process P2-2 of detecting photonic output signals using photonic receiver 132. The detecting may include, e.g., generating an electrical response indicative of signals received from photonic I/O element(s) 122 of PIC die 120. Where applicable, the photonic output signal may originate from an optical grating of photonic I/O element 122. The electrical response may be measured, analyzed, etc., to determine whether photonic I/O element(s) 122 correctly transmit photonic signals through PIC die 120. The method may then conclude ("Done"), at which point a user may mark PIC die 120 as being compliant or non-compliant with electrical and optical transmission specifications. In the case of non-compliance, PIC die 120 may be modified and re-coupled to probe 100 to perform another test.

The method as described above is used in the fabrication of integrated circuit chips. The resulting integrated circuit chips may be distributed by the fabricator in raw wafer form (that is, as a single wafer that has multiple unstructured chips), as a bare die, or in a structured form. In the latter case the chip is mounted in a single chip structure (such as a plastic carrier, with leads that are affixed to a motherboard or other higher level carrier) or in a multichip structure (such as a ceramic or an organic carrier that has either or both surface interconnections or buried interconnections). In any case the chip is then integrated with other chips, discrete circuit elements, and/or other signal processing devices as part of either (a) an intermediate product, such as a motherboard, or (b) an end product.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Approximating language, as used herein throughout the specification and claims, may be applied to modify any quantitative representation that could permissibly vary without resulting in a change in the basic function to which it is related. Accordingly, a value modified by a term or terms, such as "about," "approximately" and "substantially," are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A probe structured for electrical and photonics testing of a photonic integrated circuit (PIC) die, the probe comprising:
 a membrane having a first surface configured to face the PIC die, an opposing second surface, and including conductive traces, the membrane being configured for mechanical and electrical coupling to a probe interface board (PIB) including electrical contact pads on the first surface arranged to engage corresponding electrical contact pads on the PIB to establish electrical communication when engaged such that the PIB electrical contact pads on the PIB support the membrane;
 a set of probe tips positioned on the membrane, the set of probe tips being configured to send electrical test signals to the PIC die or receive electrical test signals from the PIC die;
 a probe body having at least portions thereof mechanically coupled to the second surface of the membrane; and
 a photonic test assembly disposed on the membrane and electrically coupled to the conductive traces of the membrane, the photonic test assembly positioned for substantial alignment with a photonic I/O element of the PIC die, wherein the photonic test assembly includes at least one of:
  a photonic emitter housed within the probe body and with which the photonic test assembly is configured to transmit a photonic input signal to the photonic I/O element; and
  a photonic receiver housed within the probe body and with which the photonic test assembly is configured to detect a photonic output signal from the photonic I/O element.

2. The probe of claim 1, wherein the membrane includes at least one opening extending between the first surface and the second surface and positioned vertically beneath the photonic test assembly.

3. The probe of claim 1, wherein one of the photonic emitter or photonic receiver is substantially vertically aligned with an optical grating coupler included within the photonic I/O element.

4. The probe of claim 1, wherein the at least one of the photonic emitter and the photonic receiver is coupled to the conductive traces of the membrane and positioned for substantial alignment with a respective photonic I/O element of the PIC die.

5. The probe of claim 1, wherein a horizontal separation between the set of probe tips and the photonic test assembly is substantially equal to a horizontal separation distance between the set of electrical contacts of the PIC die and the photonic I/O element of the PIC die.

6. The probe of claim 1, further comprising at least one solder pad electrically coupling the membrane to the photonic test assembly.

7. The probe of claim 1, wherein the photonic test assembly photonic emitter includes one of a laser diode or a reference transmitter assembly.

8. The probe of claim 1, wherein the photonic test assembly photonic receiver includes one of a photodiode or a reference receiver assembly.

9. A test assembly for a photonic integrated circuit (PIC) die, the probe assembly comprising:
 a probe including:
  a membrane having a first surface and an opposing second surface, the membrane including conductive traces,
  a set of probe tips positioned on the first surface of the membrane and electrically coupled to an electrical contact pad through the conductive traces of the membrane, the set of probe tips being configured to send and receive electrical test signals through a set of electrical contacts on the PIC die,
  a probe body, at least portions of which are mechanically coupled to the second surface of the membrane,
  a photonic emitter disposed on the second surface of the membrane, housed within the probe body, and electrically coupled to the electrical contact pad through the conductive traces of the membrane, the photonic emitter positioned for substantial alignment with a photonic I/O element of the PIC die, wherein the photonic emitter is configured to transmit a photonic input signal into the photonic I/O element of the PIC die, and
  a photonic receiver disposed on the second surface of the membrane, housed within the probe body, and electrically coupled to the electrical contact pads through the conductive traces of the membrane, the photonic receiver being positioned for substantial alignment with the photonic I/O element of the PIC die, wherein the photonic receiver is configured to detect a photonic output signal from the photonic I/O element of the PIC die; and
 a probe interface board (PIB) electrically coupled to the membrane through a set of electrical contact pads, wherein the PIB selectively applies a test signal to the probe to deliver power to each of the set of probe tips, the photonic emitter, and the photonic receiver, wherein the electrical contact pads of the PIB are arranged to engage corresponding electrical contact pads formed on the first surface of the membrane such that the electrical contact pads of the PIB are arranged to support the membrane in addition to establishing electrical connections thereto.

10. The test assembly of claim 9, wherein a horizontal separation on the probe between the set of probe tips and one of the photonic emitter or the photonic receiver is substantially equal to a horizontal separation distance between the set of electrical contacts of the PIC die and the photonic I/O element of the PIC die.

11. The test assembly of claim 9, wherein the membrane of the probe includes at least one opening extending between the first surface and the second surface and positioned vertically beneath at least one of the photonic emitter or the photonic receiver.

12. The test assembly of claim 9, wherein the photonic emitter or the photonic receiver is substantially vertically aligned with an optical grating coupler included within the photonic I/O element.

13. The test assembly of claim 9, wherein the membrane includes a substantially transparent or a substantially translucent material.

14. The test assembly of claim 9, wherein the photonic emitter comprises one of a laser diode or a reference transmitter assembly, and wherein the photonic receiver comprises one of a photodiode or a reference receiver assembly.

15. A method for testing a photonic integrated circuit (PIC) die, the method comprising:
    coupling a probe to the PIC die, wherein the probe includes:
        a membrane having a first surface arranged to face the PIC die and an opposing second surface, the membrane including conductive traces,
        a set of electrical contact pads on the first surface of the membrane for electrically coupling the membrane to a corresponding set of electrical contact pads on the probe interface board (PIB) the electrical contacts of the PIB thereby mechanically supporting the membrane when the electrical contact pads of the membrane engage the electrical contact pads of the PIB,
        a set of probe tips positioned on the first surface of the membrane and electrically coupled to the electrical contact pad through the conductive traces of the membrane, the set of probe tips being configured to send and receive electrical test signals through a set of electrical contacts on the PIC die,
        a probe body, at least portions of which are mechanically coupled to the second surface of the membrane,
        a photonic emitter disposed on the second surface of the membrane, housed within the probe body, and electrically coupled to the electrical contact pad through the conductive traces of the membrane, the photonic emitter positioned for substantial alignment with a photonic I/O element of the PIC die, wherein the photonic emitter is configured to transmit a photonic input signal into the photonic I/O element of the PIC die, and
        a photonic receiver disposed on the second surface of the membrane, housed within the probe body, and electrically coupled to the electrical contact pads through the conductive traces of the membrane, the photonic receiver being positioned for substantial alignment with the photonic I/O element of the PIC die, wherein the photonic receiver is configured to detect a photonic output signal from the photonic I/O element of the PIC die;
    applying a voltage to the set of electrical contact pads of the probe to transmit a test signal to the set of probe tips, and cause the photonic emitter to transmit the photonic input signal to the photonic I/O element of the PIC die; and
    detecting the photonic output signal from the photonic I/O element of the PIC die with the photonic receiver.

16. The method of claim 15, wherein coupling the probe to the PIC die substantially aligns the photonic emitter and the photonic receiver of the probe with the photonic I/O element of the PIC die.

17. The method of claim 15, wherein the photonic input signal transmitted from the photonic emitter passes through at least one opening extending between the first surface and the second surface of the membrane, the at least one opening being substantially vertically aligned with the photonic emitter.

18. The method of claim 15, wherein the photonic output signal detected by the photonic receiver passes through at least one opening extending between the first surface and the second surface of the membrane, the at least one opening being substantially vertically aligned with the photonic receiver.

19. The method of claim 15, further comprising wherein transmitting the photonic input signal includes transmitting the photonic input signal to an optical grating coupler of the photonic I/O element of the PIC die.

* * * * *